US007405404B1

(12) United States Patent
Shah

(10) Patent No.: US 7,405,404 B1
(45) Date of Patent: Jul. 29, 2008

(54) CEBR$_3$ SCINTILLATOR

(75) Inventor: Kanai S. Shah, Newton, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 145 days.

(21) Appl. No.: 11/233,715

(22) Filed: Sep. 23, 2005

Related U.S. Application Data

(60) Provisional application No. 60/612,963, filed on Sep. 23, 2004.

(51) Int. Cl.
*G01T 1/20* (2006.01)
*C09K 11/00* (2006.01)
*C09K 11/08* (2006.01)

(52) U.S. Cl. ............................ 250/361 R; 252/301.4 H; 252/301.4 R

(58) Field of Classification Search ............... 250/361 R; 252/301.4 H, 301.4 R
See application file for complete search history.

(56) References Cited

U.S. PATENT DOCUMENTS

| | | | |
|---|---|---|---|
| 492,722 A | 2/1893 | Gibson | |
| 3,247,377 A * | 4/1966 | Hall, Jr. | 376/165 |
| 4,510,394 A | 4/1985 | Allemand et al. | |
| 4,870,667 A * | 9/1989 | Brunnett et al. | 378/19 |
| 4,980,552 A * | 12/1990 | Cho et al. | 250/363.03 |
| 5,015,861 A * | 5/1991 | Derenzo et al. | 250/361 R |
| 5,039,858 A | 8/1991 | Anderson et al. | |
| 5,134,293 A | 7/1992 | Anderson et al. | |
| 5,272,344 A * | 12/1993 | Williams | 250/363.03 |
| 5,319,203 A | 6/1994 | Anderson et al. | |
| 5,453,623 A | 9/1995 | Wong et al. | |
| 6,362,479 B1 | 3/2002 | Andreaco et al. | |
| 6,479,420 B2 | 11/2002 | Nakamura | |
| 6,624,420 B1 | 9/2003 | Chai et al. | |
| 6,720,561 B2 | 4/2004 | Baumgartner et al. | |
| 6,787,250 B2 | 9/2004 | Shibuya et al. | |
| 7,129,494 B2 | 10/2006 | Shah | |
| 7,173,247 B2 | 2/2007 | Shah | |

(Continued)

FOREIGN PATENT DOCUMENTS

WO WO 01/60945 A2 8/2001

OTHER PUBLICATIONS

Bollinger and Thomas, "Measurement of the Time Dependence of Scintillation Intensity by a Delayed-Coincidence Method," *Rev. Sci. Instr.* 32:1044-1050 (1961).

(Continued)

*Primary Examiner*—David P. Porta
*Assistant Examiner*—Mark R Gaworecki
(74) *Attorney, Agent, or Firm*—Townsend and Townsend and Crew

(57) ABSTRACT

The present invention provides a new scintillator, cerium bromide (CeBr$_3$), for gamma ray spectroscopy. Crystals of this scintillator have been grown using the Bridgman process. In CeBr$_3$, Ce$^{3+}$ is an intrinsic constituent as well as a luminescence center for the scintillation process. The crystals have high light output (~68,000 photons/MeV) and fast decay constant (~17 ns). Furthermore, it shows excellent energy resolution for γ-ray detection. For example, energy resolution of <4% (FWHM) has been achieved using this scintillator for 662 keV photons ($^{137}$Cs source) at room temperature. High timing resolution (<200 ps-FWHM) has been recorded with CeBr$_3$-PMT and BaF$_2$-PMT detectors operating in coincidence using 511 keV positron annihilation γ-ray pairs.

29 Claims, 9 Drawing Sheets

U.S. PATENT DOCUMENTS

2004/0149917 A1*  8/2004  Dorenbos et al. ...... 250/363.03
2005/0082484 A1*  4/2005  Srivastava et al. ....... 250/361 R

OTHER PUBLICATIONS

Derenzo and Moses, "Experimental Efforts and Results in Finding New Heavy Scintillators," *Heavy Scintillators for Scientific and Industrial Applications*, F. De Notaristefani et al. eds., Gif-sur-Yvette, France: Editions Frontieres, pp. 125-135 (1993).

Derenzo, "Measurements of the Intrinsic Rise Times of Common Inorganic Scintillators," *IEEE Trans. Nucl. Sci., NS* 47:860-864 (2000).

Derenzo et al., "The Quest for the Ideal Scintillator," *Nucl. Inst. Meth. Physics Res. A* 505:111-117 (2003).

Dorenbos et al., "Non-Proportionality in the Scintillation Response and the Energy Resolution Obtainable With Scintillation Crystals," *IEEE Trans. Nucl. Sci.* 42:2190-2202 (1995).

Guillot-Noel et al., "Scintillation Properties of $RbGd_2Br_7$:Ce Advantages and Limitations," *IEEE Trans. Nucl. Sci* 46:1274-1284 (1999).

Moses et al., "Scintillation Mechanisms in Cerium Fluoride," *J. Luminescence* 59:89-100 (1994).

Moses et al., "Properties for TIme-of-Flight PET Using LSO Scintillator," *IEEE Trans. Nucl. Sci.* 46:474-478 (1999).

Moses, "Current Trends in Scintillator Detectors and Materials," *Nucl. Inst. Meth.* A-487:123-128 (2002).

van Eijk, "New Scintillators, New Light Sensors, New Applications," *Proc. Int. Conf. Inorganic Scintill. Appl.*, pp. 3-12, Shanghai, China (1998).

van Loef et al., "High Energy resolution Scintillator: $Ce^{3+}$ Activated $LaBr_3$", *Appl. Phys. Lett.* 79:1573-1575 (2001).

van Loef et al., "Scintillation Properties of $LaBr_3$:$Ce^{3+}$ Crystals: Fast, Efficient and High-Energy-Resolution Scintillators," *Nucl. Instr. Meth. Physics Res. A* 486:254-258 (2002).

* cited by examiner

CEBR₃ SCINTILLATOR

CROSS-REFERENCE

The present application claims benefit of U.S. Provisional Patent Application No. 60/612,963, filed Sep. 23, 2004, entitled "CeBr₃ Scintillator," the complete disclosure of which is incorporated herein by reference.

BACKGROUND OF THE INVENTION

The present invention relates to a scintillator. More specifically, the present invention relates to a CeBr₃ scintillator for use in gamma ray spectroscopy and x-ray detection.

Scintillation spectrometers are widely used in detection and spectroscopy of energetic photons (X-rays and γ-rays) at room temperature. These detectors are commonly used in nuclear and particle physics research, medical imaging, diffraction, non destructive testing, nuclear treaty verification and safeguards, nuclear non-proliferation monitoring, and geological exploration (Knoll *Radiation Detection and Measurement*, 3rd Edition, John Wiley and Sons, New York, (1999), Kleinknecht, *Detectors for Particle Radiation*, 2nd Edition, Cambridge University Press, Cambridge, U.K. (1998)).

Important requirements for the scintillation crystals used in these applications include high light output, high stopping efficiency, fast response, good proportionality, low cost and availability in large volume. These requirements cannot be met by any of the commercially available scintillators. As a result, there is continued interest in the search for new scintillators with enhanced performance (Derenzo, in, *Heavy Scintillators for Scientific and Industrial Applications*, De Notaristefani et al. eds., Gif-sur-Yvette, France (1993), pp. 125-135; van Eijk, Lecoq, *Proc. Int. Conf. Inorganic Scintill. Appl.*, pps. 3-12, Shanghai, China, (1997); Moses, *Nuc. Inst. Meth.* A-487:123-128 (2002)).

One of the uses in geological evaluation includes well logging or formation evaluation. These are terms used for the measurement versus depth or time, or both, of one or more physical quantities in or around a well. Typically, a logging tool is lowered into a borehole and then retrieved from the hole while recording measurements. Wireline logs are taken "downhole", transmitted through a wireline to the surface and recorded there. Measurement-while-drilling (MWD) and logging-while-drilling (LWD) measurements are also taken "downhole". The measurements are either transmitted to the surface by mud pulses, or else recorded "downhole" and retrieved later when the instrument is brought to the surface. Mud logs that describe samples of drilled cuttings are taken and recorded at the surface.

Measurements typically taken during well logging or formation evaluation involve, for example, 1) natural gamma-ray spectroscopy to measure the spectrum or number and energy of gamma-rays emitted as natural radioactivity by a formation; 2) neutron activation which provides a log of elemental concentrations derived from the characteristic energy levels of gamma-rays emitted by a nucleus that has been activated by neutron bombardment; 3) epithermal neutron porosity measurement which is a measurement based on the slowing down of neutrons between a source and one or more detectors that measure neutrons at the epithermal level, where their energy is above that of the surrounding matter; 4) elastic neutron scattering which involves neutron interaction in which the kinetic energy lost by a neutron in a nuclear collision is transferred to the nucleus; and 5) gamma-ray scattering which is used for a measurement of the bulk density of a formation based on the reduction in gamma-ray flux between a source and a detector due to Compton scattering.

Scintillation and semiconductor detectors are typically used in these logging devices. It is well known that the static temperature in a wellbore increases gradually with depth. In most of North America the increase or "gradient" will be between 0.5 and 2.5° F. for each 100 feet of increase in depth, with a value of 1.7° F./100 feet (3° C./100 meters) being typical. For these applications, one of the important characteristics of the detector is its ability to perform at high temperatures. Typical scintillators used in well logging devices include BGO and CsI(Tl) which perform poorly as temperature increases, losing half of their light output at around 75° C. and 130° C., respectively. Furthermore, the variability of output with temperature of the scintillators necessitates careful calibration procedures.

In the present invention, properties of a new scintillator, cerium bromide (CeBr₃), are disclosed. In this material, Ce³⁺ is an intrinsic constituent as well as a luminescence center for the scintillation process. The γ-ray stopping efficiency of CeBr₃ is significantly higher than that of NaI(Tl), the most common scintillation detector. Small crystals of CeBr₃ have been grown using the Bridgman process and their scintillation properties have been characterized. High light output, good proportionality, fast response and excellent energy and timing resolution have been measured for small CeBr₃ crystals. In addition, CeBr₃ was also found to possess excellent scintillation properties including high light output and fast response at high temperature (for example, at about 175° C.). Based on the results, CeBr₃ was demonstrated to be very promising for γ-ray spectroscopy and its properties were determined to be very similar to those of another recently discovered scintillator, cerium doped lanthanum bromide (LaBr₃:Ce) (van Loef et al., *Appl. Phys. Lett.* 79:1573 (2001)).

Attention is drawn to several references in the field, the teachings of which are incorporated herein by reference (as are all references cited herein):

Derenzo et al., *Nucl. Inst. Meth. Physics Res.* A 505:111-117 (2003), entitled "The Quest for the Ideal Scintillator" reviews the history of, and characteristics and mechanisms of many inorganic scintillators.

U.S. Pat. No. 5,319,203 and U.S. Pat. No. 5,134,293, both entitled "Scintillator material." Discloses Cerium fluoride and thallium doped Cerium fluoride as "improved" scintillator material.

U.S. Pat. No. 5,039,858, "Divalent fluoride doped cerium fluoride scintillator." Discloses additional doped cerium fluoride scintillators.

Moses et al., *J. Luminescence* 59:89-100 (1994), entitled "Scintillation Mechanisms in Cerium Fluoride" described studies of the scintillation mechanisms of cerium fluoride and of lanthanum fluoride doped with cerium in concentrations between 0.01% and 50% mole fraction cerium.

U.S. Pat. No. 4,510,394, "Material for scintillators." Discloses barium fluoride as scintillator material.

van Loef et al., "High energy resolution scintillator: Ce³⁺ activated LaBr₃", *Appl. Phys. Lett.* 79:1573-1575 (2001).

van Loef et al., "Scintillation properties of LaBr₃:Ce³⁺ crystals: fast, efficient and high-energy-resolution scintillators", *Nucl. Instr. Meth. Physics Res.* A 486:254-258 (2002). Discloses certain characteristics of cerium doped LaBr₃ compositions including, light yield, and scintillation decay curve. The rise time and time resolution of the compositions are not disclosed or suggested.

WO 01/60945, "Scintillator crystals, method for making same, use thereof", Discloses inorganic scintillator material of the general composition $M_{1-x}Ce_xBr_3$, where M is selected from lanthanides or lanthanide mixtures of the group consisting of La, Gd, and Y. X is the molar rate of substitution of M with cerium, x being present in an amount of not less than 0.01 mol % and strictly less than 100 mol %. The rise time and time resolution of the various compositions are not disclosed or suggested.

U.S. Pat. No. 6,362,479, "Scintillation detector array for encoding the energy, position, and time coordinates of gamma ray interactions," discloses a scintillator-encoding scheme that depends on the differential decay time of various scintillators. The use of lutetium orthosilicate-lutetium orthosilicate (LSO-LSO) crystals with a time resolution of 1.6 ns is also discussed. A time resolution of 1.6 ns is equivalent to an approximately 50 cm uncertainty, which is as large as the cross-sectional dimension of the human body, and not useful in TOF-PET.

U.S. Pat. No. 5,453,623, "Positron emission tomography camera with quadrant-sharing photomultipliers and cross-coupled scintillating crystals." Discloses arrangement of hardware elements in PET camera and use of scintillators. Only specific scintillator disclosed is BGO.

Moses et al., "Prospects for Time-of-Flight PET using LSO Scintillator," *IEEE Trans. Nucl. Sci.* 46:474-478 (1999). Discloses measurements of the timing properties of lutetium orthosilicate (LSO) scintillator crystals coupled to a PMT and excited by 511 keV photons.

BRIEF SUMMARY OF THE INVENTION

The present invention provides a cerium bromide ($CeBr_3$) scintillator. Crystals of $CeBr_3$ have been manufactured using the melt based Bridgman method. Scintillation properties of small $CeBr_3$ crystals ($\leq 0.3$ cm$^3$) include a peak emission wavelength for $CeBr_3$ at 370 nm which is well matched to PMTs as well as silicon diodes used in nuclear instrumentation and a peak wavelength for gamma ray spectroscopy.

The principal decay-time constant for $CeBr_3$ is 17 ns, which is faster than the decay-time constant of commercial PET scintillators such as BGO, LSO, NaI:Tl and GSO. The light output of $CeBr_3$ is ~68,000 photons/MeV which is more than about 2 times higher than that of LSO, more than 6-7 times higher than that for BGO and GSO, and about 76% higher than that of NaI:Tl.

The initial photon intensity—a figure of merit for timing applications is also higher for $CeBr_3$ compared to BGO, LSO, NaI:Tl and GSO (about 4,000 photons/(ns-MeV)). The combination of higher light output and faster response for $CeBr_3$ compared to existing PET scintillators promises high energy and timing resolution with $CeBr_3$ scintillators. These properties are very attractive in whole body PET imaging where the ability to reject randoms and scatter needs to be improved, and time-of-flight can be used to improve image quality. The measured timing resolution of a $CeBr_3$ crystal in coincidence with a $BaF_3$ crystal to be <200 ps (FWHM). Thus, $CeBr_3$ also provides the opportunity for time-of-flight (TOF) PET imaging which would provide additional gain in signal to noise ratio and image quality. Due to its high atomic number constituents and high density (5.2 g/cm$^3$), $CeBr_3$ provides high gamma ray sensitivity. The mean penetration depth of 511 keV photons in $CeBr_3$ is about 2.1 cm, which is comparable to YAP, and slightly larger than that for GSO, LSO and BGO. The mean penetration depth of $CeBr_3$ is substantially shorter than that for NaI:Tl.

Since $CeBr_3$ melts congruently, it can be grown using crystal growth techniques such as Bridgman and Czochralski which are generally easy to scale-up. Furthermore the melting point of $CeBr_3$ is 720° C., which is substantially lower than the melting point of LSO and GSO (>2000° C.). As a result, the eventual cost of $CeBr_3$ can be expected to be considerably lower than that of LSO and GSO. This issue is particularly relevant in modern PET instrumentation where the high cost of the detector components can be a major limitation. Thus, $CeBr_3$ appears to be a very promising scintillator for PET imaging.

In certain embodiments of the present invention, the $CeBr_3$ can be doped. In particular, the $CeBr_3$ can be doped with lutetium, e.g., $Lu^{3+}$, such as $LuBr_3$, and the like, or lanthanum, e.g., $La^{3+}$, such as $LaBr_3$, and the like. Additional dopants can include, but are not limited to, Eu, Pr, Sr, Ti, Cl, F, I, and the like. The dopant is typically present at about 0.1% or more and less than or equal to about 100% by molar weight.

In one aspect of the present invention, an X-ray detector assembly is provided that comprises a scintillator material comprising $CeBr_3$, a photon detection assembly, and a data analysis system. The photon detection assembly can comprise a photomultiplier tube, a photo diode, or a PIN detector. The crystal can be coated with, a reflective layer, a moisture resistant layer, or a vapor barrier, and the like. The reflective layer is typically to cover the surfaces of the scintillator crystal not exposed to the photon detector assembly.

In another aspect this invention comprises a positron emission scanner system comprising a patient area and an assembly of radiation detectors disposed adjacent the patient area. The radiation detectors comprise a fast scintillator comprising cerium bromide. A scintillation light detector or photomultiplier tube are optically coupled to the scintillator. A control system is coupled to the light detectors or photomultiplier tube.

In one configuration, the scintillator is used in coincidence detection positron emission tomography by recording the differential arrival time of two photons so as to localize the annihilation event. Advantageously, the localization is carried out within a distance that is less than about 30 cm.

The positron emission tomography scanner typically includes two or more radiation detectors, in which each scintillation light detector of the radiation detector comprises a position sensitive detector or array. The scanner typically includes means to correct for different timing offsets of each of the individual radiation detectors. Such timing offsets o the individual radiation detectors are stored in a memory in the control system. For example, in one configuration, for each radiation detector the timing offsets are subtracted from each gamma-ray time arrival value prior to computation of a localization. In another configuration, timing signals of individual radiation detectors are equalized by an introduction of individual hardwired delays in signal readout electronics in the control system.

Optionally, the scanner, comprising two or more scintillators, uses $CeBr_3$ in combination with other scintillators.

In a further embodiment the present invention comprises an X-ray computed tomography (CT) scanner system comprising a patient area and a penetrating x-ray source. A detector assembly is positioned adjacent the patient area on a substantially opposite side of the patient area. The detector assembly comprises a scintillator comprising cerium bromide.

The cerium bromide fast scintillator composition of the present invention also possess additional characteristics necessary for an X-ray CT scanner system, such as for example, high detection efficiency (high density and atomic number), high light output, linear light output with energy, fast decay time, low cost and ease of crystal fabrication.

An additional embodiment of the present invention is a method of performing time-of-flight positron emission tomography. Such methods use a scintillator comprising cerium bromide (CeBr$_3$). The scintillator typically has a fast component with a decay constant of about 17 nanoseconds, and a time resolution of less than 500 picoseconds (ps), and preferably below 0.4 nanoseconds (ns). The scintillator may comprise a decay constant of about 17 nanoseconds.

The imaging method comprises injecting or otherwise administering a patient with a detectable label, and after a sufficient period of time to allow localization or distribution of the label, placing the patient within the field of view of the device. When a 511 keV gamma ray is detected by any one first detector, the device opens a time window (no less than up to about 1 ns long for the whole body, but longer if the time resolution of the device is worse than 1 ns, e.g., 10 ns for one of the scanners described above). If another 511 keV event is detected within this time window at a second detector that is across the body from the first detector (or, in some embodiments, where each detector comprises position sensing built within it), the position within the detector and the detector's position are recorded, as well as the arrival times. Each positive pair defines a line. From the known body size, the length of the line need not be the distance between detectors, it can be just the size of the cross the body from the first detector, this event is accepted as a coincidence. The position of the first and second detectors (or, in some configurations where each detector comprises position sensing built within it, the position within the detector and the detector's position) are recorded, as well as the arrival times.

Each position pair defines a line. From the known body size, the length of the line needed not be the distance between detectors, it can be just the size of the body cross-section. If there is no time-of-flight (TOF) information, equal probability is assigned to each point on the line. The reconstruction of the image then proceeds by one of the dozens of algorithms known in the art. If TOF information is available, then the probability of origin of the event along the line can be represented as a Gaussian or similar distribution of width equal to the TOF FWHM, centered on the most probable point. Similar reconstruction algorithms, modified to take advantage of the TOF information can be used for reconstruction, and these modifications are also well known in the art.

In another embodiment, the present invention provides a method of localizing a positron annihilation event within a portion of a human body cross-section. In the method a positron emission tomography scanner (or camera) is used wherein the scanner comprises a scintillator comprising cerium bromide (CeBr$_3$).

The scintillator may have a decay constant of about 17 nanoseconds, an attenuation length of about 2.1 cm, a light output of about 68,000 photons/MeV, an initial photon intensity of about 4,000 photons/(ns×MeV), and a time resolution of less than or equal to about 0.200 nanoseconds.

In yet another embodiment, the cerium bromide fast scintillator composition of the present invention also possess additional characteristics necessary for a well logging or formation evaluation system, such as for example, maintenance of high light output and proportionality of response at high temperature. In particular, CeBr$_3$ retains about 75% of its light output at 175° C. and a non-proportionality of only 5% at a gamma-ray energy range of 100 keV to 1 MeV. These values are substantially better than those of other commercial scintillators. The device suitable for well logging can comprise a detector assembly comprising a scintillator comprising CeBr$_3$ and a photon detection assembly. The CeBr$_3$ scintillator further comprises a dopant, such as for example, Lu, La, Eu, Pr, Sr, Tl, Cl, F, or I. In particular embodiments the Lu dopant can be LuBr$_3$ or the La dopant can be LaBr$_3$. Typically, the dopant is present in an amount of 0.1% to less than 100% by molar weight. In certain embodiments of a well logging device, the device can further comprise a radioactive energy source that emits neutrons and/or gamma-rays. The device can further comprise a data analysis system, a well wire for transferring the data to the surface of a data recording device, and the like. The photon detection assembly used in a well logging device can comprise a photomultiplier tube, a photo diode, a PIN detector, or even an avalanche detector.

For a fuller understanding of the nature and advantages of the present invention, reference should be had to the ensuing detailed description taken in conjunction with the accompanying drawings. The drawings represent embodiments of the present invention simply by way of illustration. The invention is capable of modification in various respects without departing from the invention. Accordingly, the drawings and description of these embodiments are illustrative in nature, and not restrictive.

DETAILED DESCRIPTION OF THE INVENTION

Figure 1:
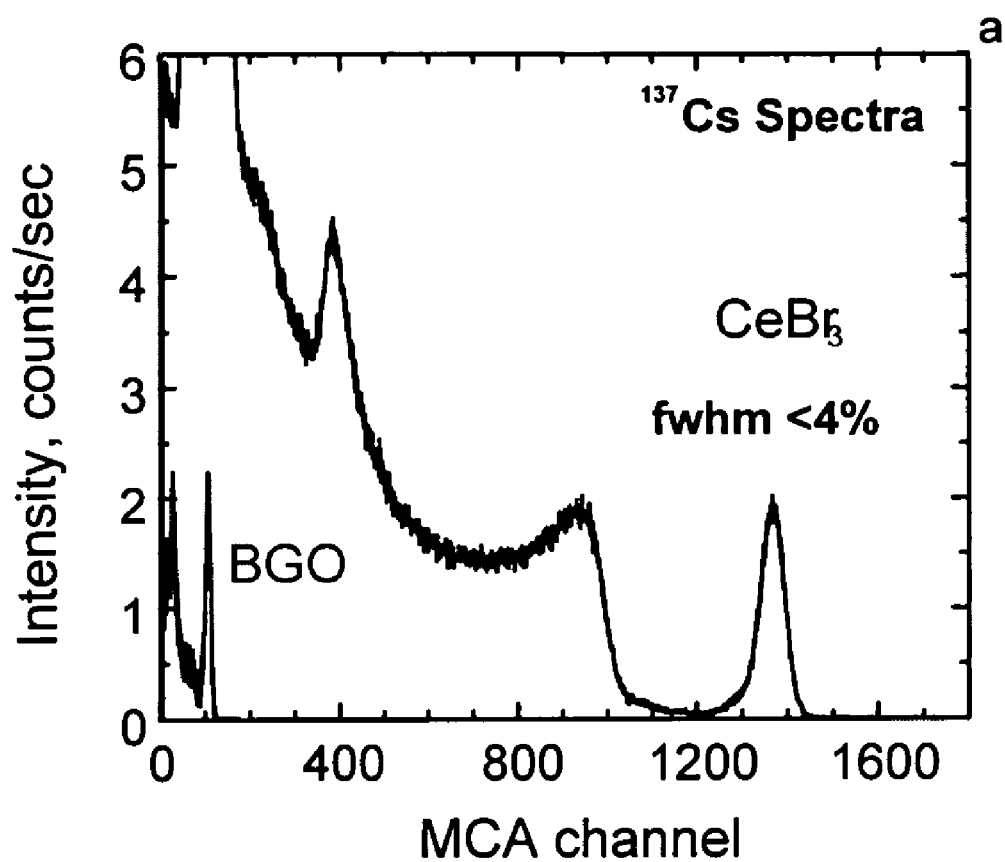
FIG. 1 depicts a $^{137}$Cs spectra collected with CeBr$_3$ and BGO crystals coupled to a PMT. The light output of CeBr$_3$ has been estimated to be ~68,000 photons/MeV. The energy resolution of 662 keV peak for CeBr$_3$ was 3.4% (FWHM) at room temperature.

This invention will be better understood with resort to the following definitions:

A. Rise time, in reference to a scintillation crystal material, shall mean the speed with which its light output grows once a gamma ray has been stopped in the crystal. The contribution of this characteristic of a scintillator combined with the decay time contribute to a timing resolution. A timing resolution of less than 500 picosecond (ps) is of particular interest for use in methods comprising time-of-flight detection of an annihilation event as originating within about a 30 cm distance.

B. A Fast timing scintillator should be capable of localizing an annihilation event as originating from within about a 30 cm distance, i.e., from within a human being scanned. This typically requires a timing resolution of about 500 ps or less.

C. Timing accuracy or resolution, usually defined by the full width half maximum (FWHM) of the time of arrival differences from a point source of annihilation gamma-rays. Because of a number of factors, there is a spread of measured values of times of arrival, even when they are all equal. Usually they distribute along a bell-shaped or Gaussian curve. The FWHM is the width of the curve at a height that is half of the value of the curve at its peak.

D. Light Output shall mean the number of light photons produced per unit energy deposited by the detected gamma-ray, typically the number of light photons/keV.

E. Stopping power or attenuation shall mean the range of the incoming X-ray or gamma-ray in the scintillation crystal material. The attenuation length, in this case, is the length of crystal material needed to reduce the incoming beam flux to $1/e^-$.

F. Proportionality of response (or linearity). For some applications (such as CT scanning) it is desirable that the light output be substantially proportional to the deposited energy.

G. Coincidence timing window/coincidence detection shall mean the length of time allowed for deciding whether two detected 511 keV gamma-rays belong to the same positron annihilation event. This window is desired to be as short as possible, but no shorter than the time it takes the gamma-rays to travel through the body (>1 nsec).

Scintillators are the most widely used detectors for spectroscopy of energetic photons (X-rays and gamma-rays). These detectors are commonly used in nuclear and high energy physics research, medical imaging, diffraction, non-destructive testing, nuclear treaty verification and safeguards, and geological exploration. Important requirements for the scintillation crystals used in these applications include high light output, high gamma ray stopping efficiency (attenuation), fast response, low cost, good proportionality, and minimal afterglow. These requirements have not been met by any of the commercially available scintillators, and there is continued interest in the search for additional scintillators with enhanced performance.

H. Single line time-of-flight (TOF) localization shall mean the process by which, through timing of the signals, the position of the annihilation event is localized to a portion of the line joining the detectors, this portion being smaller than the length of the line.

I. Position sensitive detector or array shall mean a detector where the position of the gamma-ray interaction within the detector is determined. In some embodiments this is done through the Anger principle of light division (well known in the state of the art). For instance, there can be a photodetector at each end of the crystal and the proportion of light reaching each detector determines position, or an array of photodetectors where the center of mass of the light distribution determines position (i.e., the closest detectors get more light).

J. Method to correct for different timing offsets of an individual detector shall be understood to include, among others, software code that stores each detector's individual timing delay and code to subtract from each timing signal this pre-stored value. Method to introduce through delay lines (cables through which the signal travels) a fixed delay for each detector, so that their signals all have the same arrival delay at the timing electronics.

In the practice of the present invention, attention is paid to the physical properties of the scintillator material. In most embodiments a robust scintillator crystal or ceramic is preferred. Similarly, in particular applications, properties such as hygroscopy (tendency to absorb water), brittleness (tendency to crack), and crumbliness should be minimal.

TABLE I

Properties of Scintillators

| Material | Light Output (Photons/MeV) | Wavelength of Emission (nm) | Attenuation Length (511 keV) (cm) | Initial Photon Intensity (Photons/(nsMev)) | Principal Decay Time (ns) |
| --- | --- | --- | --- | --- | --- |
| NaI(Tl) | 38,000 | 415 | 3.3 | 165 | 230 |
| CsI(Tl) | 52,000 | 540 | 1.9 | 50 | 1000 |
| LSO | 24000 | 420 | 1.2 | 600 | 40 |
| BGO | 8,200 | 505 | 1.1 | 30 | 300 |
| $BaF_2$ | 10,000 ~2,000 fast | 310 slow 220 fast | 2.3 | 3,400 (total) | 620 slow 0.6 fast |
| GSO | 7,600 | 430 | 1.5 | 125 | 60 |
| $CdWO_4$ | 15,000 | 480 | 1.1 | 3 | 5000 |
| YAP | 20,000 | 370 | 2.1 | 570 | 26 |
| $LaBr_3$ (0.5% Ce)[1] | 61,000 | 360 | 2.1 | 1,850 | 31 |
| $LaBr_3$ (0.5% Ce)[2] | 68,000 | 370 | 2.1 | 2,600 | 26 |
| $LaBr_3$ (5% Ce)[2] | 62,500 | 370 | 2.1 | 4,300 | 16 |
| $LaBr_3$ (10% Ce)[2] | 64,500 | 370 | 2.1 | 3,900 | 16 |
| $LaBr_3$ (20% Ce)[2] | 64,000 | 375 | 2.1 | 3,600 | 17 |
| $LaBr_3$ (30% Ce)[2] | 69,500 | 375 | 2.1 | 3,650 | 18.6 |
| $LuI_3$ (0.5% Ce) | 47,000 | 470 | 1.7 | 1,300 | 31 |
| $LuI_3$ (5% Ce) | 50,000 | 474 | 1.7 | 1,800 | 25 |
| $CeBr_3$ | 68,000 | 370 | 2.1 | 4,000 | 17 |

[1]Data based on the Delft University of Technology results (See, van Loef et al., Nucl. Inst. Meth. Phys. Res. A 486:254-258 (2002)).
[2]Data and results provided in U.S. patent application Nos. 10/948913, filed Sep. 23, 2004; 10/948914, Sep. 23, 2004, the disclosures of which are incorporated herein by reference in their entirety.

Table I provides a listing of certain properties of a number of scintillators. Compared to CsI, which is among the scintillation materials with the highest known light output, $CeBr_3$ produces more light (approximately 68,000 to about 50,000 photon/MeV). In addition $CeBr_3$ has a fast principal decay constant (about 17 ns), a very fast light output (initial photons), and the energy resolution of CeBr$_3$ coupled to a PMT and measured at 662 keV was about 4% (FWHM). The timing resolution of a CeBr$_3$-PMT operating in coincidence mode was measured to be less than 200 ps (FWHM).

As will be understood by one of skill in the art, fast scintillators are used in conjunction with methods to calibrate each detector to correct for differential time lags that confuse relative timing measurements. In particular embodiments, such corrections are performed by introducing hardwired delays of appropriate lengths or by software processing based on pre-stored delay times for each detector. Within the practice of the present invention scintillators are used in individual detectors (detector modules) or read by position-sensitive photodetectors or arrays of photodetectors that detect the light from the scintillation of the crystal or ceramic.

The applications of these fast detectors are not limited to PET cameras. They are also useful in applications where fast decay of the light signal is desirable. One such application is X-ray computed tomography (CT), where, as rotation times and individual detector size decreases, detector response time become more important. The high linearity of output of the scintillators of the present invention is of particular use in this application.

Notable parameters for the scintillation crystals used in spectroscopy of energetic photons (gamma-rays) as well as neutrons at room temperature applications include high light output, high stopping efficiency, fast response, low cost, good linearity, and minimal afterglow.

In additional embodiments, particularly use in geologic formation analysis it is important the detection devices for gamma-rays as well as neutrons comprise scintillators that are stable at high temperature. For example, in devices used in well logging and formation evaluation scintillators are exposed to temperatures as high as 170° C. and higher. Typical scintillators used today lose a significant amount of light output and proportionality as the temperature of the environment approaches 150 to 200° C. or more. The CeBr$_3$ scintillator of the present invention is useful in all variations of well logging devices that use scintillation detection. The devices are varied depending on the type of measurement being carried out. Measurements made that are relevant to this embodiment include, but are not limited to, natural gamma-ray spectroscopy where the spectrum or number and energy of gamma-rays emitted as natural radioactivity by the formation are measured. There are three sources of natural radioactivity in the Earth. These include $^{40}$K, $^{232}$Th and $^{238}$U, or potassium, thorium, and uranium respectively. These radioactive isotopes emit gamma-rays that have characteristic energy levels. The quantity and energy of these gamma-rays can be measured in a radiation detector. A log of natural gamma-ray spectroscopy is usually presented as a total gamma-ray and the weight fraction of potassium (%), thorium(ppm), and uranium (ppm).

Neutron activation is a log of elemental concentrations derived from the characteristic energy levels of gamma-rays emitted by a nucleus that has been activated by neutron bombardment. A wireline log of the yields of different elements in the formation is measured using induced gamma-ray spectroscopy with a pulsed neutron generator. The elemental yields are derived from two intermediate results: a) the inelastic and b) the capture spectrum. The inelastic spectrum is the basis for the carbon-oxygen log, and can also give information on other elements. The capture spectrum depends on many elements, mainly hydrogen, silicon, calcium, iron, sulfur and chlorine. Since the elemental yields give information only on the relative concentration of elements, they are normally given as ratios. These ratios are indicators of, for instance, oil, salinity, lithology, porosity and clay. To get absolute concentrations, it is necessary to calibrate to cores or, more often, use a model such as the oxide-closure model.

Epithermal neutron porosity measurement is a measurement based on the slowing down of neutrons between a source and one or more detectors that measure neutrons at the epithermal level, where their energy is above that of the surrounding matter, between approximately 0.4 and 10 eV. The slowing-down process is dominated by hydrogen, and is characterized by a slowing-down length. By measuring the neutrons at the epithermal level, rather than the thermal level, the response is a purer estimate of hydrogen index, unaffected by thermal absorbers. On the other hand, the count rate is smaller for the same source and source-detector spacing. Epithermal measurements have been made with both the compensated neutron technique and by using a pad pressed against the borehole wall with detectors focused into the formation.

Elastic neutron scattering involves neutron interaction in which the kinetic energy lost by a neutron in a nuclear collision is transferred to the nucleus. The energy of a neutron is reduced more efficiently in collisions with nuclei of similar mass to the neutron, like hydrogen and other elements of low atomic mass. Elastic neutron scattering is one of the main processes behind the neutron porosity log, as well as the pulsed neutron capture log, which is mainly used to determine water saturation behind a casing.

Gamma-ray scattering is used for a measurement of the bulk density of the formation, based on the reduction in gamma-ray flux between a source and a detector due to Compton scattering. The gamma-ray source, usually $^{137}$CS (cesium), is chosen so that gamma-ray energies are high enough to interact by Compton scattering but not by pair production. The detectors discriminate against low gamma-ray energies that may have been influenced by photoelectric absorption. The measurement responds to the average density of the material between source and detector. In the wireline measurement, care is taken to minimize the mud between the sensors and the formation by pressing a pad against the borehole wall, with the source and detector focused into the formation. In the logging-while-drilling measurement, a sleeve may be mounted on the collar around the sensors to exclude the mud. The detectors measure the gamma-rays scattered from the formation.

Scintillation and semiconductor detector are typically used in these logging devices. For the above applications, one of the important characteristics of the detector is its ability to perform at high temperatures. BGO and CsI(Tl) perform poorly as temperature increases, losing half of their light output at around 75° C. and 130° C., respectively. Furthermore, the variability of light output with temperature has necessitated careful calibration procedures. CeBr$_3$ of the present invention even at 175° C. the scintillator retains about 75% of its light output, with a much smaller variability as a function of temperature.

Therefore, the scintillators of the present invention meet many of the requirements for fast scintillation crystal compositions.

EXAMPLES

Example 1

The present example provides a method for growing and provides characterization for CeBr$_3$ scintillator crystals.

The following examples are offered by way of illustration, not by way of limitation.

Crystal Growth of CeBr$_3$

CeBr$_3$ has hexagonal crystal structure and its density is 5.2 g/cm$^3$. The compound melts congruently at 722° C. and therefore its crystals can be grown using melt based methods such as Bridgman and Czochralski. This is fortunate because these melt-based processes are well suited for growth of large volume crystals (Brice, *Crystal Growth Processes*, Blackie Halsted Press (1986)). The Bridgman method has been used for growing CeBr$_3$ crystals because this technique is easy to implement, and can provide good indication of the feasibility of producing high quality crystals of CeBr$_3$ from the melt. Ultra-dry CeBr$_3$ was used with 99.99% purity. A two zone Bridgman furnace was used with temperature in the hotter zone above the melting point CeBr$_3$ (722° C.) and that of the cooler zone less than 722° C. CeBr$_3$ crystals (<1 cm$^3$) were grown in quartz ampoules using the Bridgman method. Small sections were cut from the solid ingots and polished using non aqueous slurries (due to hygroscopic nature of CeBr$_3$) prepared by mixing mineral oil with Al$_2$O$_3$ grit. Some crystals were then packaged to prevent long exposure to moisture.

Scintillation Properties of CeBr$_3$

Scintillation properties of small Bridgman grown CeBr$_3$ crystals ($\leq$0.3 cm$^3$) have been characterized. This investigation involved measurement of the light output, the emission spectrum, and the fluorescent decay time of the crystals. Energy and timing resolution of CeBr$_3$ crystals and their proportionality of response were also measured. Based on its high density CdBr$_3$ demonstrated high gamma ray stopping efficiency. The attenuation length of 511 keV photons in CeBr$_3$ was 2.1 cm.

1. Light Output and Energy Resolution

The light output of CeBr$_3$ crystals was measured by comparing their response to 662 keV γ-rays ($^{137}$Cs source) to the response of a calibrated BGO scintillator to the same isotope (see FIG. 1). This measurement involved optical coupling of a CeBr$_3$ crystal to a photomultiplier tube (with multi-alkali S-20 photocathode), irradiating the scintillator with 662 keV photons and recording the resulting pulse height spectrum. In order to maximize light collection, the CeBr$_3$ crystal was wrapped in reflective, white Teflon tape on all faces (except the one coupled to PMT). An index matching silicone fluid was also used at the PMT-scintillator interface. A pulse height spectrum was recorded with a CeBr$_3$ crystal. This experiment was then repeated with a calibrated BGO scintillator. Comparison of the photopeak position obtained with CeBr$_3$ for 662 keV photon energy to that with BGO provided estimation of light output for the CeBr$_3$ crystal. FIG. 1 shows the pulse height spectra for both CeBr$_3$ and BGO under $^{137}$Cs irradiation and amplifier shaping time of 4.0 μsec. This shaping time is long enough to allow full light collection from both the scintillators. The PMT bias and amplifier gain were same for both spectra. Based on the recorded photopeak positions for CeBr$_3$ and BGO, and by taking into account the photocathode quantum efficiency for BGO and CeBr$_3$, light output of CeBr$_3$ crystal was estimated to be about 68,000 photons/MeV. This light output was amongst the highest values for inorganic scintillators (Knoll, *Radiation Detection and Measurement*, 3rd Edition, John Wiley and Sons(1999)); Rodyni, *Physical Processes in Inorganic Scintillators*, CRC Press, New York (1997)).

The energy resolution of the 662 keV photopeak recorded with CeBr$_3$ scintillator has been measured to be <4% (FWHM) at room temperature as shown in FIG. 1, which was substantially better than the energy resolution of 6-7% (FWHM) at 662 keV obtained with established scintillators such as NaI(Tl) and CsI(Tl). The energy resolution of CeBr$_3$ crystals at 662 keV approached that of room temperature semiconductor detectors such as CdTe and CdZnTe (2-3% FWHM at 662 keV).

2. Emission Spectrum

Figure 2:
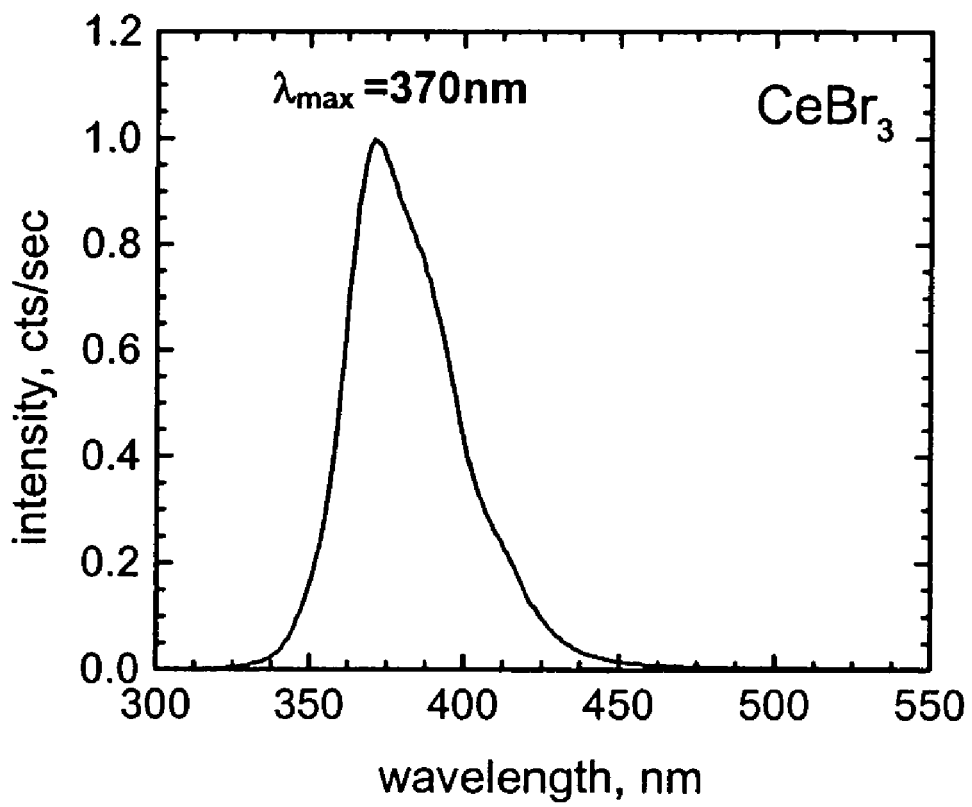
FIG. 2 depicts the optical emission spectrum for a CeBr$_3$ scintillator upon exposure to X-rays.

The emission spectrum of the CeBr$_3$ scintillators has been measured. The CeBr$_3$ samples were excited with radiation from a Philips X-ray tube having a Cu target, with power settings of 30 kVp and 15 mA. The scintillation light was passed through a McPherson monochromator and detected by a Hamamatsu R2059 photomultiplier tube with a quartz window. The system was calibrated with a standard light source to enable correction for sensitivity variations as a function of wavelength. A normalized emission spectrum for a CeBr$_3$ sample is shown in FIG. 2. The peak emission wavelength for the CeBr$_3$ sample was at ~370 nm and this emission was anticipated to be due to 5d→4f transition of Ce$^{3+}$. The peak emission wavelength of 370 nm for CeBr$_3$ is attractive for gamma ray spectroscopy because it matches well with the spectral response of the photomultiplier tubes as well as a new generation of silicon photodiodes.

3. Decay Time

Figure 3:
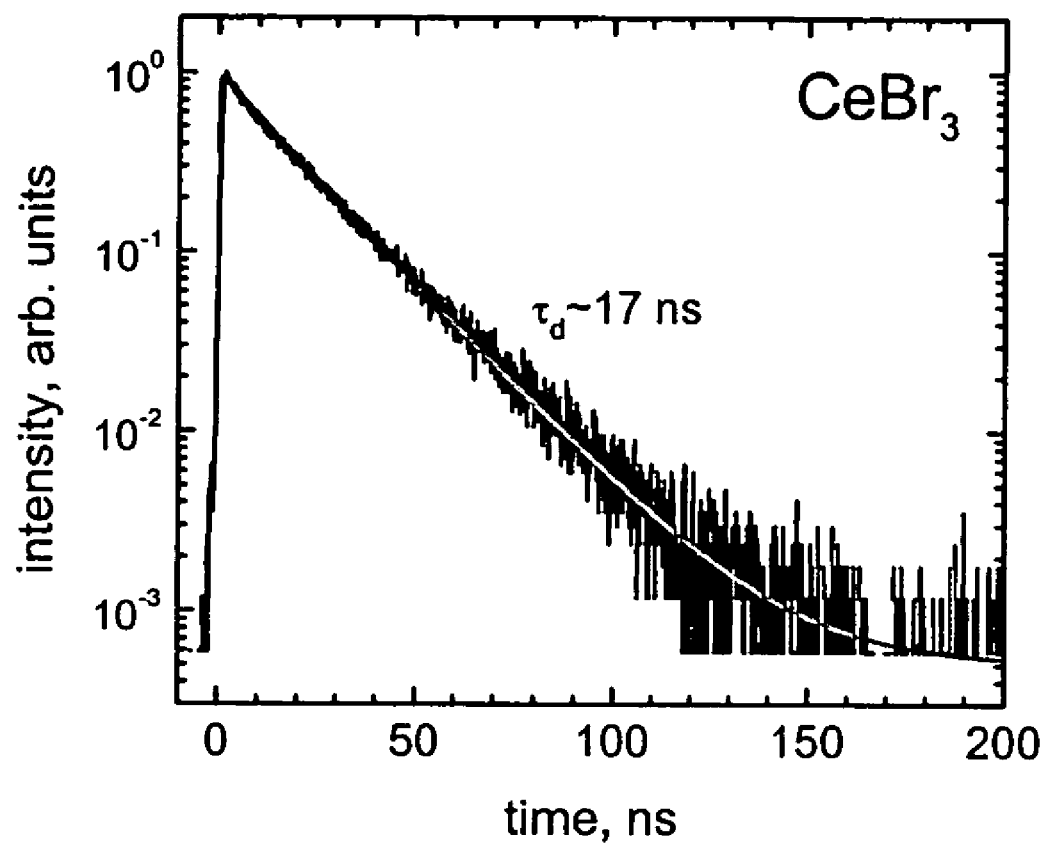
FIG. 3 depicts the decay-time spectrum for a CeBr$_3$ scintillator.

Decay-time spectrum of a CeBr$_3$ crystal has been measured using the delayed coincidence method (Bollinger and Thomas, *Rev. Sci. Instr.* 32:1044 (1961)). FIG. 3 shows the decay-time spectrum recorded for a CeBr$_3$ sample along with a theoretical fit (with an exponential rise and decay time plus background) to the data. The decay constant for the sample was 17 ns and this component covered all of the integrated light output of the sample. This decay component can be attributed to optical emission arising from direct capture of electron-hole pairs at the Ce$^{3+}$ sites. The risetime of the scintillation pulse from CeBr$_3$ has been estimated to be ~0.1 ns using the data shown in FIG. 4. The initial photon intensity, a figure of merit for timing applications, has been estimated to be ~4,000 photons/(ns×MeV) for CeBr$_3$, which is higher compared to all common inorganic scintillators (including BaF$_2$, a benchmark for timing applications).

4. Coincidence Timing Resolution

Figure 4:
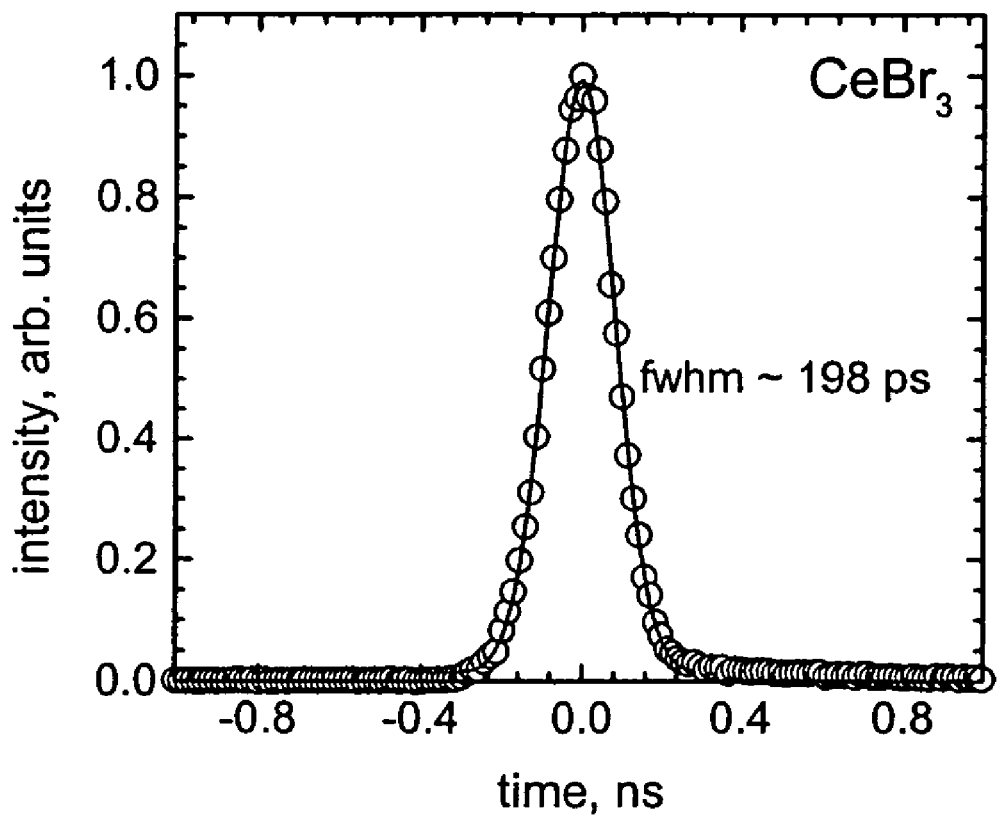
FIG. 4 illustrates the timing resolution for CeBr$_3$ and BaF$_2$ crystals in coincidence. For two BaF$_2$ crystals in coincidence, the timing resolution with the same setup was 210 ps (FWHM).

Coincidence timing resolution of CeBr$_3$ crystals has also been measured. This experiment involved irradiating a BaF$_2$ and a CeBr$_3$ scintillator, each coupled to a fast PMT (Hamamatsu RS320) with 511 keV positron annihilation γ-ray pairs (emitted by a $^{22}$Na source). The BaF$_2$-PMT detector formed a "start" channel in the timing circuit, while the CeBr$_3$-PMT detector formed the "stop" channel. The signal from each detector was processed using two channels of a Tennelec TC-454 CFD that had been modified for use with the MCP-PMTs. The time difference between the start and stop signals was digitized with a Tennelec TC-862 TAC and a 16-bit ADC, resulting in a TDC with 7.5 ps per bin resolution. Data were accumulated until the coincidence timing distribution had approximately 10,000 counts in the maximum bin. FIG. 4 shows a coincidence timing resolution plot acquired in this manner with CeBr$_3$ and BaF$_2$ crystals and the timing resolution was measured to be <200 ps (FWHM). Using the same setup, the timing resolution of two BaF$_2$ crystals in coincidence was measured to be 210 ps (FWHM).

These results confirmed that CeBr$_3$ was well suited for applications requiring fast response, high count-rates, and good timing resolution. Based on its high timing resolution, CeBr$_3$ scintillators can be expected to provide accurate time-of-flight (TOF) information.

5. Proportionality of Response

Figure 5:
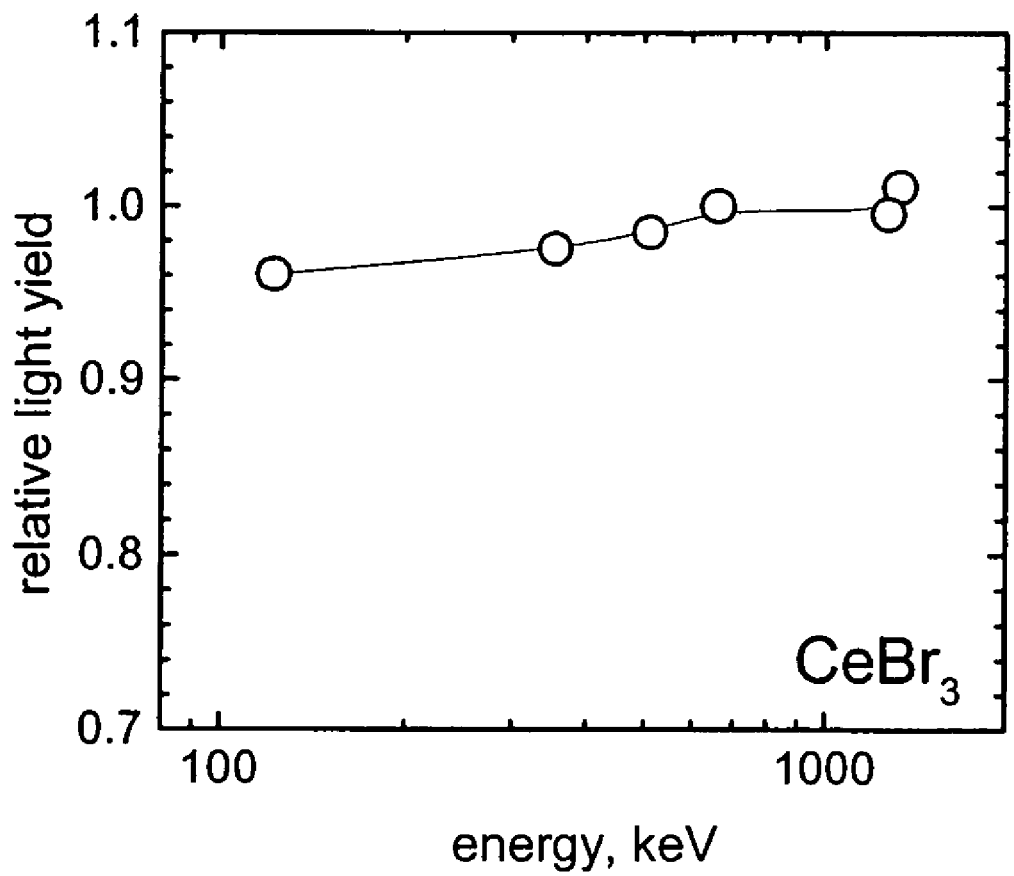
FIG. 5 demonstrates the proportionality of response for a CeBr$_3$ crystal. Over 100 keV to >1 MeV gamma ray energy range, the non-proportionality for CeBr$_3$ is 5%.

The proportionality of response of CeBr$_3$ scintillators was evaluated. Non-proportionality (as a function of energy) in light yield can be one of the important reasons for degradation in energy resolution of established scintillators such as NaI (Tl) and CsI(Tl) (Dorenbos et al., *IEEE Trans. Nuc. Sci.* 42:2190 (1995)). As a result, light output of CeBr$_3$ was measured under excitation from isotopes such as $^{57}$Co (122 keV γ-rays), $^{22}$Na (511 keV and 1275 keV γ-rays) and $^{137}$Cs (662 keV γ-rays). A CeBr$_3$ crystal was wrapped in Teflon tape and coupled to a PMT. Pulse height measurements were performed using standard NIM equipment with the scintillator exposed to different isotopes. The same settings were used for PMT and pulse processing electronics for each isotope. From the measured peak position and the known γ-ray energy for each isotope, the light output (in photons/MeV) at each γ-ray energy was estimated. The data points were then normalized with respect to the light output value at 662 keV energy and the results (shown in FIG. 5) indicated that CeBr$_3$ was a very proportional scintillator. Over the energy range from 100 to 1275 keV, the non-proportionality in light yield was about 4% for CeBr$_3$ which was substantially better than that for many established scintillators (Guillot-Noel et al., *IEEE Trans. Nuc. Sci* 46: 1274-1284 (1999)). The higher proportionality of CeBr$_3$ can be expected to enhance its energy resolution.

Overall, these measurements clearly indicated that CeBr$_3$ was a promising scintillator. It has high light output, fast response and shows very high energy and timing resolution. It also showed good proportionality of response over the γ-ray energy range from 100 to 1275 keV.

Basic PET Configuration

Figure 6:
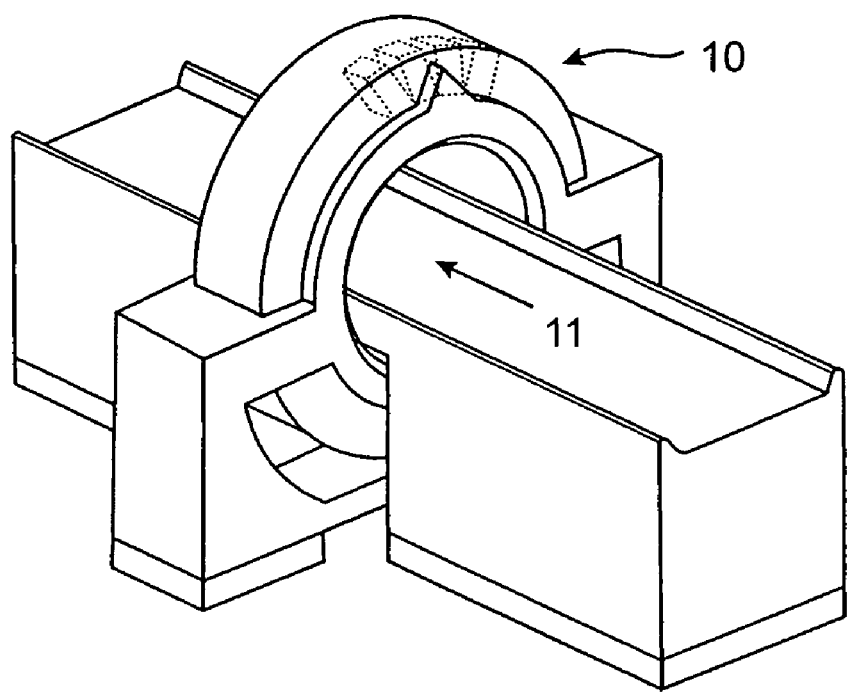
FIG. 6 shows a schematic of a positron emission scanner system.

A PET camera system typically comprises of a polygonal or circular ring of radiation detectors (10) placed around a patient area (11), as shown in FIG. 6. In some embodiments radiation detection begins by injecting or otherwise administering isotopes with short half-lives into a patient's body placeable within the patient area (11). As noted above, the isotopes are taken up by target areas within the body, the isotope emitting positrons that are detected when they generate paired coincident gamma-rays. The annihilation gamma-rays move in opposite directions, leave the body and strike the ring of radiation detectors (10).

Figure 7:
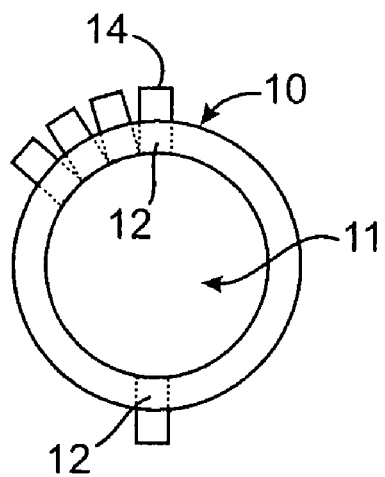
FIG. 7 shows a schematic of the detector arrangement for a positron emission scanner system.

As shown in FIG. 7, the ring of detectors (10) includes an inner ring of scintillators (12) (e.g., CeBr$_3$) and an attached ring of light detectors or photomultiplier tubes (14). The scintillators (12) respond to the incidence of gamma rays by emitting a flash of light (scintillation) that is then converted into electronic signals by a corresponding adjacent photomultiplier tube or light detectors (14). A computer control system (not shown) records the location of each flash and then plots the source of radiation within the patient's body. The data arising from this process is usefully translated into a PET scan image such as on a PET camera monitor by means known to those in the art.

Figure 8:
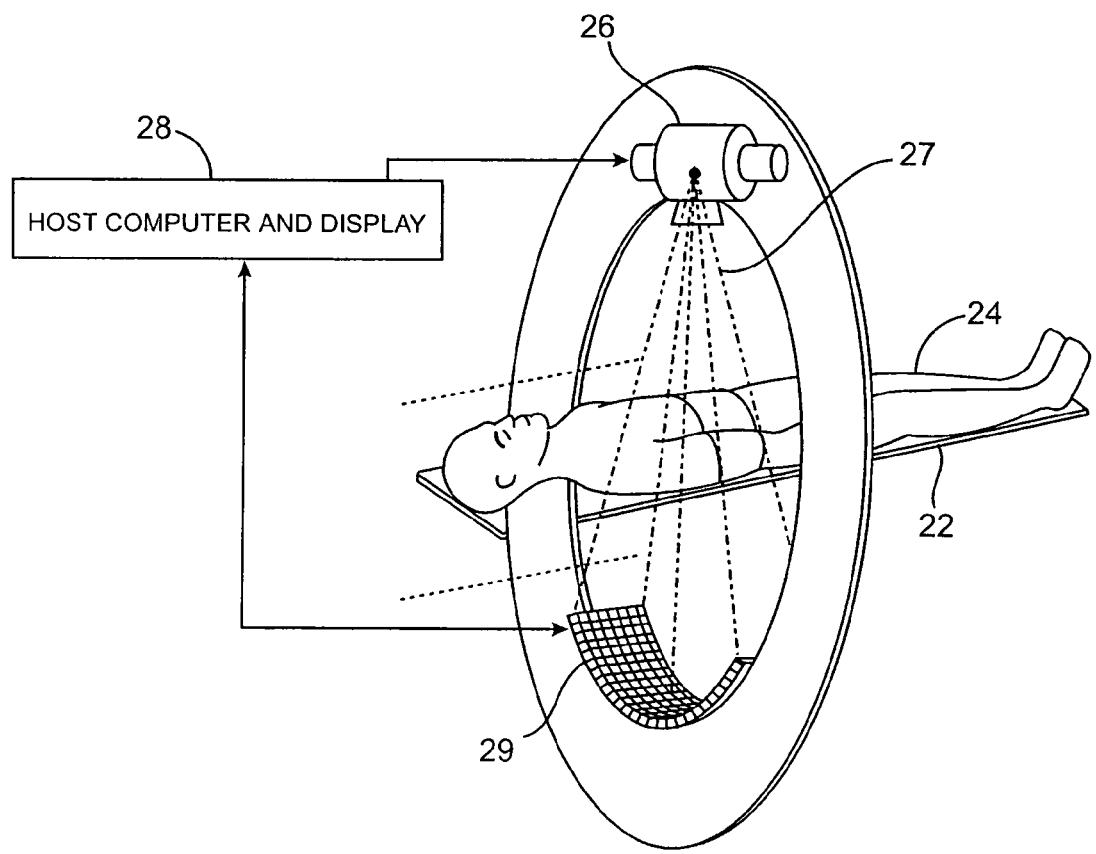
FIG. 8 shows a schematic of an x-ray computed tomography scanner system encompassed by the present invention.

This invention has been discussed in terms of CeBr$_3$:Ce crystal scintillators for use in PET, and particularly useful in time-of-flight PET. Such application of the technology is illustrative only. Many, indeed most, ionizing radiation applications will benefit from the inventions disclosed herein. Specific mention is made to X-ray CT, X-ray fluoroscopy, X-ray cameras (such as for security uses), and the like. A CT scanner as shown in FIG. 8, as well known to the skilled artisan, typically comprises a patient bed 22, a penetrating X-ray source 26 (i.e., an X-ray tube), a detector assembly 29 and associated processing electronics 29, and a computer and software for image reconstruction, display, manipulation, post-acquisition calculations, storage and retrieval 28.

Example 2

The following example examines the characteristic of various scintillators at high temperature.

Experimental Setup for High Temperature Studies

A custom designed oven for elevating and maintaining the temperature of both photomultiplier tube (PMT) and scintillator was built. The device consisted of a high temperature PMT along with a thermocouple placed inside an aluminum shell that was heated with a resistive band. The assembly along with insulation was placed on a Teflon substrate. Since unpackaged crystals of LaBr$_3$, LaCl$_3$, and CeBr$_3$ were used in the study, dry nitrogen was circulated around the PMT and the scintillator to prevent hydration of these moisture sensitive materials. Nitrogen, PMT and scintillator were heated up to 175° C. using a standard heating tape wrapped around the aluminum casing between the inner and outer walls. The temperature inside the chamber was controlled to ±1° C. by using a type K thermocouple connected to an Athena temperature controller (#16CTF0000). For these studies, a Hamamatsu R4607-01 photomultiplier tube with a circular cage dynode structure was used. The PMT used needs to be rugged and capable of operation at temperatures up to 175° C. The PMT used employs a high temperature bialkali photocathode and has room temperature quantum efficiency of about 17% at 375 nm.

The quantum efficiency of the PMT was first measured as a function of temperature. A blue LED ($\lambda_{max}$=395 nm), placed outside the chamber, was used and it irradiated the PMT via a fused silica light guide. The response of the PMT to the LED irradiation was recorded as a function of temperature. From PMT quantum efficiency of 16% at 395 nm at 25° C. published by the manufacturer, and the measured PMT response over 25 to 175° C., the quantum efficiency versus temperature relationship (for blue light that LaBr$_3$:Ce, LaCl$_3$:Ce and CeBr$_3$ emit) was estimated for the Hamamatsu R4607-01 photomultiplier tube. The PMT response as a function of temperature was useful in estimation of light yield of scintillators as a function of temperature.

Figure 9:
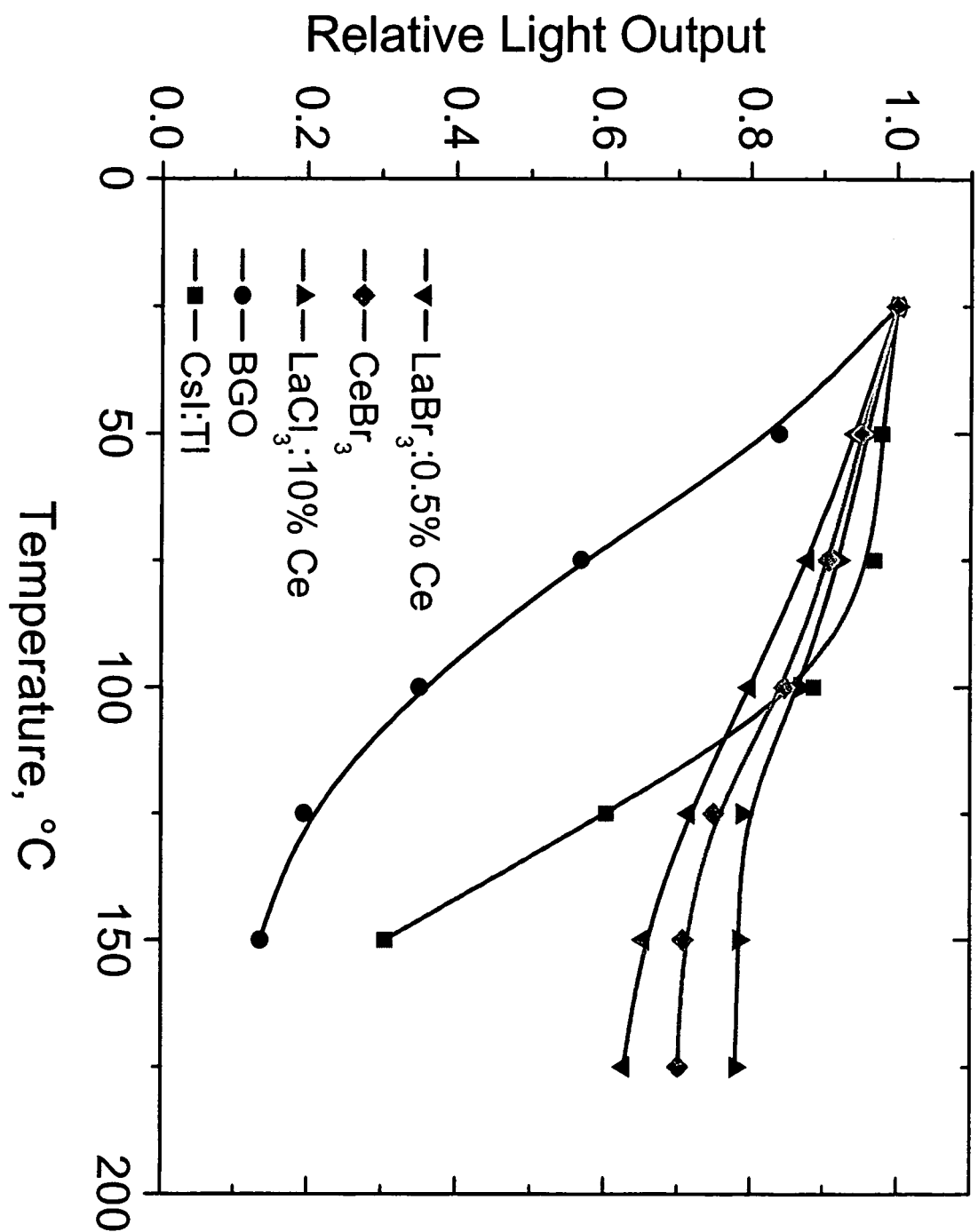
FIG. 9 shows the variation in relative light output (yield) of CeBr$_3$, LaBr$_3$(0.5% Ce), LaCl$_3$(10% Ce), BGO and CsI:Tl as a function of temperature.

Scintillation Properties of LaBr$_3$:Ce, LaCl$_3$:Ce and CeBr$_3$ Crystals at Elevated Temperatures Once the experimental setup for high-temperature studies was available, the scintillation properties of LaBr$_3$ (0.5% Ce), LaCl$_3$ (10% Ce) and CeBr$_3$ were characterized in the temperature range of about 25 to about 175° C. The output of the PMT was connected to a Can berra 2005 preamplifier and a Can berra 2020 spectroscopic amplifier, both of which were placed outside the chamber. Crystals were optically coupled to the PMT using a high viscosity epoxy and wrapped in several layers of reflecting Teflon tape to maximize light collection while maintaining the coupling to the PMT at higher temperatures. Temperature dependent pulse height spectra were recorded with a $^{137}$Cs source using a shaping time of 4 μs. Photopeak position was obtained by fitting it with a single Gaussian band to estimate the light yield of the sample under investigation. The variation in relative light yield of LaBr$_3$:Ce, LaCl$_3$:Ce and CeBr$_3$ over 25 to 175° C. temperature range is shown in FIG. 9. Also shown in the figure is the measured variation in relative light yield of established scintillators such as BGO and CsI:Tl over 25 to 150° C. temperature range for comparison. As seen in the figure, the light yield of LaBr$_3$:Ce, LaCl$_3$:Ce and CeBr$_3$ remained high at elevated temperatures and at 175° C., the light output remained at 63%, 78% and 70%, respectively of their room temperature value. The drop in light yield of CsI:Tl and BGO at temperatures above 100° C. is substantially more as shown in FIG. 9.

Figure 10:
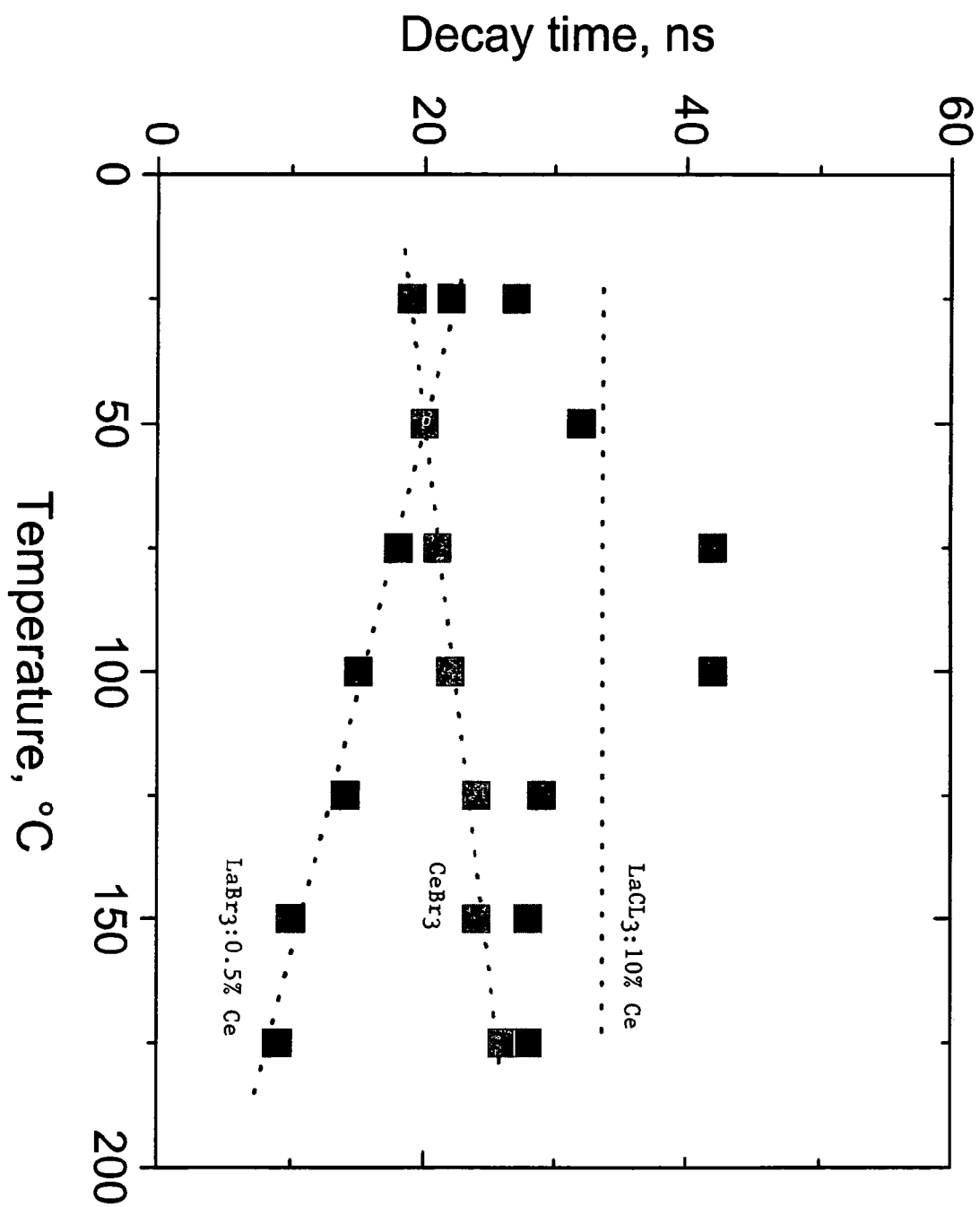
FIG. 10 shows the principal decay-time constant (in ns) for LaBr$_3$(0.5% Ce), LaCl$_3$(10% Ce) and CeBr$_3$ as a function of temperature.

High temperature scintillation decay time spectra were recorded for LaBr$_3$:Ce, LaCl$_3$:Ce and CeBr$_3$ using a $^{137}$CS source and a Tektronix TDS 220 oscilloscope connected to the output of the PMT (without any additional amplification or shaping). By fitting the measured data to multi-exponential fits, the principal decay-time constants for LaBr$_3$:Ce, LaCl$_3$:Ce and CeBr$_3$ were measured and the results, as a function of operating temperature, are shown in FIG. 10. It should be noted that at room temperature as well as at 175° C., the principal decay time constants for all three materials remain fast (<30 ns). The values at room temperature, shown in FIG. 10, are similar to those reported earlier, and the deviations can be explained by taking into consideration differences in operating temperatures and measurement techniques. As seen in FIG. 10, the principal decay-time constant of LaBr$_3$:Ce became shorter with increasing temperature, which was probably due to luminescence quenching. An increase in energy transfer from the host lattice to Ce-sites could also be an explanation for the observed trend. In the case of CeBr$_3$, the principal decay time constant increased slightly with temperature, which could have been due to the formation of some stable traps at higher temperatures. The observed behavior of LaCl$_3$:Ce may have been due to a combination of these explanations. Further experiments are requirements to develop a comprehensive understanding of the scintillation mechanisms that govern high temperature response of these materials.

Overall, the above data confirm that these materials indeed show fast response at elevated temperature, with a principal decay time constant <30 ns for all three materials at 175° C. From the room-temperature as well as elevated-temperature measurements, the absolute light yield (in photons/MeV) and the principal decay-time constant (in ns) have been computed for LaBr$_3$:Ce, LaCl$_3$:Ce and CeBr$_3$ at 175° C. and the results are summarized in Table II.

TABLE II

Scintillation Properties of LaBr$_3$:Ce, CeBr$_3$, and LaCl$_3$:Ce at 175° C.

| Scintillation Material | Light Yield (Photons/MeV) | Principal Decay Constant (ns) |
|---|---|---|
| LaBr$_3$ (0.5% Ce) | 47,000 | 9 |
| CeBr$_3$ | 48,000 | 26 |
| LaCl$_3$ (10% Ce) | 37,000 | 28 |

As seen in Table II, all three materials demonstrated excellent scintillation properties (high light output and fast response) at the temperature of 175° C. The light yield of LaBr$_3$:Ce and CeBr$_3$ at 175° C. was substantially higher than that of other commercial scintillators. For example, amongst the commercially established scintillators, NaI:Tl, CsI:Tl, BGO and CsI:Na, above temperature of 120° C., NaI:Tl is known to be brighter than the rest. At 175° C., the light output of NaI:Tl drops to ~50% of its room temperature. Thus, LaBr$_3$:Ce, LaCl$_3$:Ce and CeBr$_3$ all show substantially higher light yield at 175° C. compared to NaI:Tl and other commercial scintillators. Furthermore, at 175° C., the light yield of LaBr$_3$:Ce and CeBr$_3$ was about two times higher than that for NaI:Tl.

It is also worth noting that based on the shape of the light yield-temperature curves for CeBr$_3$ shown in FIG. 9, it is possible that at even higher temperatures (approximately 200° C.), CeBr$_3$ may show a higher light yield than LaBr$_3$:Ce.

The initial investigation of proportionality of response of these rare earth halide scintillation materials at 175° C. has also been carried out and the results indicate that over 100 keV to 1 MeV gamma-ray energy range, the non-proportionality is ~5%. This indicates that these materials should provide excellent energy resolution at high temperatures. In fact, the energy resolution of these rare earth halide scintillators is comparable to their room temperature value. Some degradation in energy resolution at even higher temperatures was observed, mostly due to the drop in the quantum efficiency of the PMT used at elevated temperatures. However, in our measurements at 150° C. using $^{137}$CS source (662 keV photons), the energy resolution achieved with CeBr$_3$, LaBr$_3$:Ce and LaCl$_3$:Ce was ~3.5 times better than that for CsI:Tl and >9 times better than that for BGO. It can be expected that when coupled to PMTs that have a higher quantum efficiency at elevated temperature, these scintillators should provide excellent energy resolution due to their high light yield and good proportionality at elevated temperatures.

The present invention provides a new scintillation material, CeBr$_3$, for γ-ray detection and for uses requiring a fast scintillator. The present disclosure concentrated on growth of CeBr$_3$ crystals using the Bridgman method, as well as characterization of the scintillation properties of these crystals. Measurements indicated that CeBr$_3$ was a promising scintillator. It has high light output, a fast response and shows good energy and timing resolution. Based on its performance, this new scintillation material appears to be useful for applications such as medical imaging (positron emission tomography or PET and single photon emission computed tomography or SPECT, and the like), nuclear and particle physics research, X-ray diffraction, non-destructive evaluation, nuclear treaty verification and non-proliferation monitoring, environmental cleanup, and geological exploration.

Although the foregoing invention has been described in some detail by way of illustration and example for purposes of clarity of understanding, it will be obvious that certain changes and modifications may be practiced within the scope of the appended claims. The scope of the invention should, therefore, be determined not with reference to the above description, but instead should be determined with reference to the appended claims along with their full scope of equivalents.

All publications and patent documents cited in this application are incorporated by reference in their entirety for all purposes to the same extent as if each individual publication or patent document were so individually denoted.

What is claimed is:

1. A self-activated scintillator comprising a cerium bromide (CeBr$_3$) material.

2. An X-ray detector assembly comprising:
   a self-activated scintillator comprising a CeBr$_3$ material;
   a photon detection assembly, and
   a data analysis system.

3. The X-ray detector of claim 2, wherein the photon detection assembly comprises a photomultiplier tube, a photo diode, or a PIN detector.

4. The X-ray detector if claim 2, wherein the scintillation material is coated with a reflective layer, a moisture resistant layer, or a vapor barrier.

5. A positron emission tomography scanner system comprising:
   a patient area;
   an assembly of radiation detectors disposed adjacent the patient area, wherein the radiation detectors comprise:
   a self-activated scintillator comprising of a cerium bromide (CeBr$_3$) material;

a scintillation light detector or photomultiplier tube optically coupled to the scintillator; and a control system coupled to the light detectors or photomultiplier tubes.

6. The positron emission tomography scanner of claim 5, wherein said scintillator is used in coincidence detection positron emission tomography by recording the differential arrival time of two photons so as to localize the annihilation event.

7. The positron emission tomography scanner of claim 6, wherein the localization is to within a distance of less than about 30 cm.

8. The positron emission tomography scanner of claim 5, wherein the radiation detector comprises two or more radiation detectors, wherein each scintillation light detector comprises a position sensitive detector or array.

9. The positron emission tomography scanner of claim 8, wherein timing signals of individual radiation detectors are equalized by an introduction of individual hardwired delays in signal readout electronics in the control system.

10. The positron emission tomography scanner of claim 5, further comprising a means to correct for different timing offsets of each individual radiation detector.

11. The positron emission tomography scanner of claim 5, wherein timing offsets of individual radiation detectors are stored in a memory in the control system.

12. The positron emission tomography scanner of claim 11, wherein for each radiation detector the timing offsets are subtracted from each gamma-ray time arrival value prior to computation of a localization.

13. An X-ray computed tomography scanner system comprising:

a patient area;

a penetrating X-ray source; and a detector assembly comprising a self-activated scintillator comprising a cerium bromide ($CeBr_3$) material.

14. A method of performing time-of-flight positron emission tomography comprising:

administering a patient with a detectable label;

positioning the patient within a field of view of a scintillator to detect emissions from the patient, wherein the scintillator is a self-activated scintillator comprising a cerium bromide ($CeBr_3$) material; and detecting a positron annihilation event within a portion of a cross-section of the patient's body for generating an image of the patient.

15. A well logging device comprising:

a detector assembly comprising a self-activated scintillator comprising a $CeBr_3$ material, and a photon detection assembly.

16. The well logging device of claim 15, further comprising a radioactive energy source.

17. The well logging device of claim 16, further comprising a data analysis system.

18. The well logging device of claim 15, wherein the photon detection assembly comprises a photomultiplier tube, a photo diode, a PIN detector, or an avalanche detector.

19. A scintillator comprising a cerium bromide material, wherein Br is the only halide present in the scintillator.

20. The scintillator of claim 19, further comprising a dopant.

21. The scintillator of claim 20, wherein the dopant comprises Lu, La, Eu, Pr, Sr, Tl, Cl, F, or I.

22. The scintillator of claim 21, wherein the dopant is Lu or La, and the Lu dopant is $LuBr_3$ or the La dopant is $LaBr_3$.

23. The scintillator of claim 20, wherein the dopant is present in an amount of 10% or less by molar weight.

24. The scintillator of claim 19, wherein the scintillator is a fast scintillator.

25. The scintillator of claim 19, wherein the scintillator comprises a decay time of less than 30 nanoseconds.

26. The scintillator of claim 19, wherein the scintillator comprises a timing resolution of better than 1 nanosecond.

27. The scintillator of claim 19, wherein the scintillator comprises a timing resolution of better than 0.5 nanoseconds.

28. The scintillator of claim 19, wherein the scintillator comprises a timing resolution of better than about 0.2 nanoseconds.

29. The scintillator of claim 19, wherein the scintillator comprises a light output of at least about 68,000 photons/MeV.

* * * * *